US011119542B2

(12) United States Patent
Sundaram et al.

(10) Patent No.: US 11,119,542 B2
(45) Date of Patent: Sep. 14, 2021

(54) HINGE ANGLE DETECTION

(71) Applicant: Intel Corporation, Santa Clara, CA (US)

(72) Inventors: Arvind Sundaram, Bangalore (IN); Samarth Alva, Bangalore (IN); Yogesh Channaiah, Mandya (IN)

(73) Assignee: Intel Corporation, Santa Clara, CA (US)

(*) Notice: Subject to any disclaimer, the term of this patent is extended or adjusted under 35 U.S.C. 154(b) by 10 days.

(21) Appl. No.: 16/367,684

(22) Filed: Mar. 28, 2019

(65) Prior Publication Data

US 2019/0220066 A1    Jul. 18, 2019

(30) Foreign Application Priority Data

Jan. 8, 2019  (IN) .............................. 201941000900

(51) Int. Cl.
   *G06F 1/16*   (2006.01)
   *G01D 5/14*   (2006.01)
   *G01R 33/07*  (2006.01)

(52) U.S. Cl.
   CPC .......... *G06F 1/1681* (2013.01); *G01D 5/145* (2013.01); *G01R 33/072* (2013.01); *G06F 1/1677* (2013.01)

(58) Field of Classification Search
   CPC ..... G06F 1/1681; G06F 1/1677; G01D 5/145; G01R 33/072
   See application file for complete search history.

(56) References Cited

U.S. PATENT DOCUMENTS

| 6,249,426 B1* | 6/2001 | O'Neal ................. G06F 1/1616 16/334 |
| 2014/0360296 A1* | 12/2014 | Hsu ....................... G06F 1/1618 74/98 |
| 2019/0253000 A1* | 8/2019 | Kratchman ............ H02N 1/004 |

FOREIGN PATENT DOCUMENTS

CN             111414044 A      7/2020

\* cited by examiner

*Primary Examiner* — Clayton E. LaBalle
*Assistant Examiner* — Michael A Harrison
(74) *Attorney, Agent, or Firm* — Patent Capital Group

(57) ABSTRACT

Particular embodiments described herein provide for an electronic device that includes a first housing, a second housing, and a hinge. The hinge rotatably couples the first housing to the second housing and includes an off-center lobe that generates a field. The second housing includes a detection engine to detect a strength of the field generated by the off-center lobe and determines a hinge angle (or a position of the first housing relative to the second housing) based on the detected strength of the field generated by the off-center lobe.

20 Claims, 10 Drawing Sheets

HINGE ANGLE DETECTION

CROSS-REFERENCE TO RELATED APPLICATIONS

This application claims the benefit of priority to Indian Provisional Patent Application Serial No. 201941000900 filed on Jan. 8, 2019 and entitled HINGE ANGLE DETECTION. The disclosure of the prior application is considered part of and are hereby incorporated by reference in its entirety in the disclosure of this application.

TECHNICAL FIELD

This disclosure relates in general to the field of computing, and more particularly, to a hinge angle detection system.

BACKGROUND

End users have more electronic device choices than ever before. A number of prominent technological trends are currently afoot and these trends are changing the electronic device landscape. Some of the technological trends involve clamshell devices. Generally, clamshell devices are devices where a first housing is rotatably coupled to a second housing. For example, a laptop, notebook computer, etc., is a small, portable personal computer with a clamshell form factor typically having, a computer display mounted on the inside of an upper first housing of the clamshell and an alphanumeric keyboard on the inside of a lower second housing of the clamshell. The clamshell device is opened to use the device and folded shut for transportation or storage.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
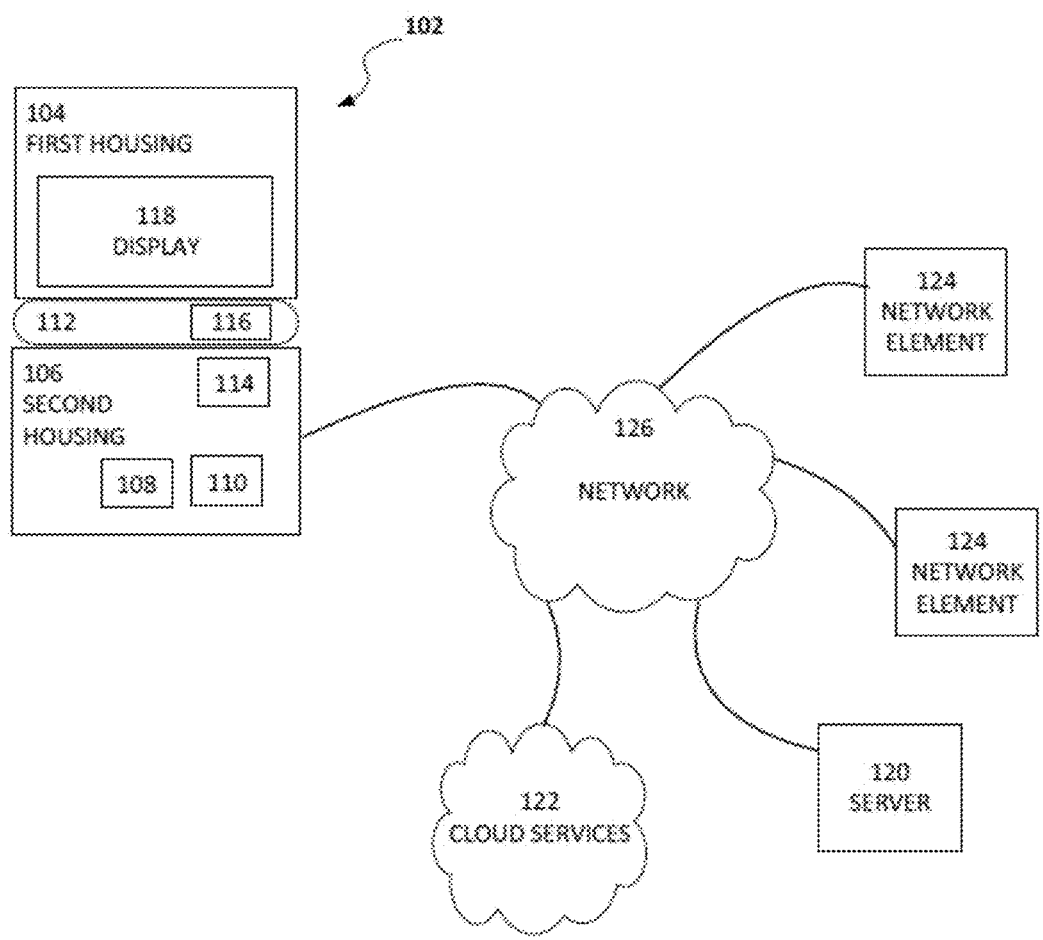
FIG. 1 is a simplified block diagram of a system to enable a hinge angle detection system, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to enabling a hinge angle detection system in accordance with an embodiment of the present disclosure. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents. For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. The term "coupled" may mean one or more of the following. The term "coupled" may mean that two or more elements are in direct physical or electrical contact. However, the term "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

FIG. 1 is a simplified block diagram of an electronic device configured to enable a hinge angle detection system, in accordance with an embodiment of the present disclosure. In an example, an electronic device 102 can include a first housing 104 and a second housing 106. First housing 104 can include a display 118. Second housing 106 can include memory 108, one or more processors (CPU) 110, and hinge detection engine 114.

First housing 104 can be rotatably coupled to second housing 106 using a hinge 112. Hinge 112 can include an off-center lobe 116. Off-center lobe 116 can be configured to generate a field, flux, radiation, resistance, etc. that can be detected by hinge detection engine 114. In an example, off-center lobe 116 generates a magnetic reluctance field and hinge detection engine 114 includes a transducer to detect the strength of the magnetic reluctance field generated by off-center lobe 116. In a specific example, the transducer measures changes in magnetic reluctance to detects the strength of the field generated by off-center lobe 116. In some examples, the transducer is a hall effect sensor.

As first housing 104 rotates relative to second housing 106, off-center lobe 116 also rotates. As off-center lobe 116 rotates, the field, flux, radiation, resistance, etc. that can be detected by hinge detection engine 114 becomes stronger or weaker due to off-center lobe 116 being off-center of the axis of rotation between first housing 104 and second housing 106. Hinge detection engine 114 can analyze the change in the field, flux, radiation, resistance, etc. and determine the angle of rotation of first housing 104 relative to second housing 106. Based on the determined angle of rotation of first housing 104 relative to second housing 106 (or determined position of first housing 104 relative to second housing 106), an image on display 118 can be changed. Electronic device 102 may be in communication with a server 120, cloud services 122, and/or one or more network elements 124 using network 126.

It is to be understood that other embodiments may be utilized and structural changes may be made without departing from the scope of the present disclosure. Substantial flexibility is provided by an electronic device in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

Elements of FIG. 1 may be coupled to one another through one or more interfaces employing any suitable connections (wired or wireless), which provide viable pathways for network (e.g., network 126, etc.) communications. Additionally, any one or more of these elements of FIG. 1 may be combined or removed from the architecture based on particular configuration needs. Network 126 may include a configuration capable of transmission control protocol/Internet protocol (TCP/IP) communications for the transmission or reception of packets in a network. Electronic device 102 may also operate in conjunction with a user datagram protocol/IP (UDP/IP) or any other suitable protocol where appropriate and based on particular needs.

For purposes of illustrating certain example techniques of electronic device 102, the following foundational information may be viewed as a basis from which the present disclosure may be properly explained. Generally, clamshell devices are devices where a first housing is rotatably coupled to a second housing. For example, a clamshell device can be a laptop, notebook computer or other a small, portable personal computer with a clamshell form factor typically having a computer display mounted on the inside of an upper first housing of the clamshell and an alphanumeric keyboard on the inside of a lower second housing of the clamshell. The clamshell is opened to use the device and folded shut for transportation or storage.

With the ever-increasing types of compute device form factors there is the ever increasing need to make devices smarter and context aware. Some of the interesting form factors include 3 in 1s, 2 in 1s and folding display systems. There is a unique requirement where the device is self-aware of the mode the device is in—for example a foldable display system can be in laptop mode or table top mode or phablet mode. There is the need for a low-cost sensor that is able to sense these modes in a reliable manner. A device should be able to determine a relative position between two halves without the need for additional computation. Existing implementations need a suite of sensors like accelerometer and gyro and are also computationally intensive thereby making them less desirable and more expensive.

Some current existing systems to detect the angle between two housings (e.g., in a laptop the angle between the base and the display) is to use a combination of accelerometers, gyroscopes, and magnetometers. These systems detect the change in acceleration and rotational movement and compute the hinge angle. The disadvantage of these systems is that they are relatively expensive, computationally involved, and are not static. If a device is also moving (being carried) and the hinge is activated, the resulting readout is often erroneous. Moreover, the signal is not carried through power states and needs to be recomputed every time the system power cycles or goes into standby Rotational encoder systems are very accurate but they are also relatively expensive. Systems based on optical encoders are larger than 5 mm, and are too large for hinges and often have problems with dust and other particulate interferences. Magnetopot based systems can be reliable but are also relatively expensive and can have a high variability and tolerance. Resistive encoder based systems are contact based sensors and are prone to contact jitters and wear and tear which does not make them a good long term solution. In addition, they are not hermetically sealed. Capacitive proximity sensors are able to read proximity of even nonmetallic parts but this can cause wrong or false readings. Also, they can be difficult to implement as capacitive proximity front end is analog circuit design intensive and also needs complex designs to make it reliable. Capacitive proximity sensors also need adaptation to measure rotary angles and 360 deg movements. What is needed is system and method that can help to detect a position of a hinge of an electronic device.

A system and method to help facilitate a hinge angle detection system can resolve these issues (and others). In an example, a hinge (e.g., hinge 112) can include an off-center lobe (e.g., off-center lobe 116) that is configured to generate a field, flux, radiation, resistance, etc. that can be detected by a hinge detection engine (e.g., hinge detection engine 114). In an example, the off-center lobe may generate a variable reluctance that can be measured to detect the angle between a first housing (e.g., first housing 104) and a second housing (e.g., second housing 106). In other examples, the off-center lobe may generate a variable capacitance, resistance, or some other field that can be detected by a hinge detection engine. This allows the of measurement of the hinge angle to use the hinge itself, or a flex cable through the hinge, as the sensing element rather than use a separate sensor medium. The moving air gap created by the off centric lobe causes the reluctance coupling to change with the hinge angle thereby providing a direct readout of the angle between a first housing and a second housing.

The off-center lob can allow for static sensing of hinge angles and is not affected by power states. In addition, in the case of dual hinge systems where there are three moving halves, the computational needs of the conventional sensing are too complex and error prone. The off-center lob can allow for accurate hinge angles at low computational need and has relatively low complexity at a relatively low cost. The detection of the field, flux, radiation, resistance, etc. by the hinge detection engine can be highly robust and not prone to drift, ageing etc. In addition, the differential measurement of the field, flux, radiation, resistance, etc. that can be detected by the hinge detection engine ensures relatively accurate readouts. (e.g., greater than 0.3 degrees rotational angle accuracy). In an example, the off-centered lob can be hermetically sealed.

Turning to the infrastructure of FIG. 1, network 126 represents a series of points or nodes of interconnected communication paths for receiving and transmitting packets of information. Network 126 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 126, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic device 102, is meant to encompass an electronic device that includes a hinge where a position of one housing in relation to another housing may need to be determined, especially a computer that has a clamshell form factor, a laptop or electronic notebook, network elements that have a clamshell form factor, or any other device, component, element, or object that has a clamshell form factor, design, profile, etc. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements (e.g., memory 108) for storing information to be used in the operations outlined herein. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, the functions outlined herein may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 102 may include software modules (e.g., hinge detection engine 114, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 102 may include a processor (e.g., CPU 110) that can execute software or an algorithm to perform activities as discussed herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
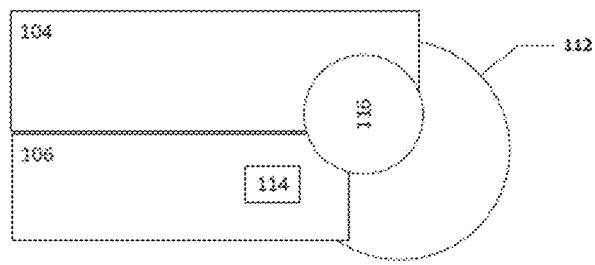
FIGS. 2A-2C are simplified block diagrams of a portion of a system to enable a hinge angle detection system, in accordance with an embodiment of the present disclosure.

Turning to FIG. 2A, FIG. 2A is a simplified block diagram of electronic device 102 configured to include a hinge angle detection system. As illustrated in FIG. 2A, when first housing 104 is over second housing 106 in a closed clamshell configuration, off-center lobe 116 is relatively close to hinge detection engine 114. Because off-center lobe 116 is relatively close to hinge detection engine 114, the field, flux, radiation, resistance, etc. detected by hinge detection engine 114 from off-center lobe 116 is relatively strong. Hinge detection engine 114 can analyze the strength of the field, flux, radiation, resistance, etc. from off-center lobe 116 and determine that the angle of rotation of first housing 104 relative to second housing 106 (or determined position of first housing 104 relative to second housing 106) is in the position illustrated in FIG. 2A.

Figure 2B:
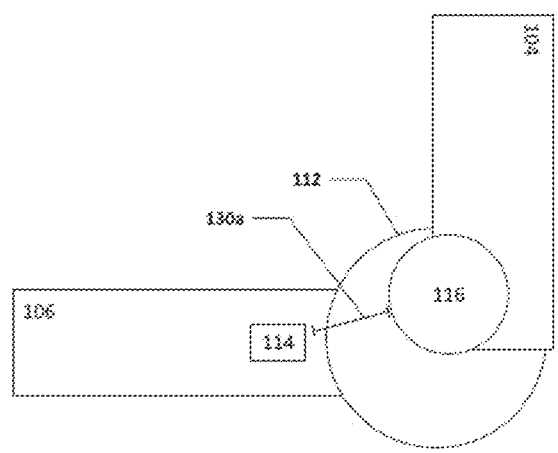

Turning to FIG. 2B, FIG. 2B is a simplified block diagram of electronic device 102 configured to include a hinge angle detection system. As illustrated in FIG. 2B, when first housing 104 is rotated relatively to second housing 106 to an open configuration, off-center lobe 116 is a distance 130a from hinge detection engine 114. Because off-center lobe 116 is distance 130a from hinge detection engine 114, the field, flux, radiation, resistance, etc. detected by hinge detection engine 114 from off-center lobe 116 is not as strong as when first housing 104 was over second housing 106 in a closed clamshell configuration as illustrated in FIG. 2A. Hinge detection engine 114 can analyze the strength of the field, flux, radiation, resistance, etc. from off-center lobe 116 and determine that the angle of rotation of first housing 104 relative to second housing 106 (determined position of first housing 104 relative to second housing 106) is in the open position illustrated in FIG. 2B.

Figure 2C:
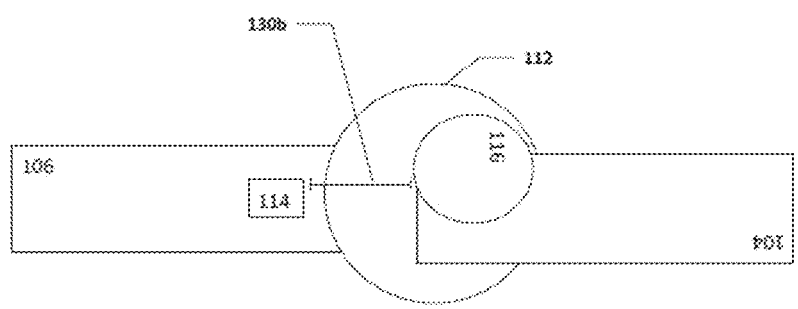

Turning to FIG. 2C, FIG. 2C is a simplified block diagram of electronic device 102 configured to include a hinge angle detection system. As illustrated in FIG. 2C, when first housing 104 is rotated relatively to second housing 106 to a relatively flat configuration, off-center lobe 116 is a distance 130b from hinge detection engine 114. Because off-center lobe 116 is distance 130b from hinge detection engine 114, the field, flux, radiation, resistance, etc. detected by hinge detection engine 114 from off-center lobe 116 is not as strong as when first housing 104 was over second housing 106 in a closed clamshell configuration as illustrated in FIG. 2A or when first housing 104 was rotated relatively to second housing 106 to an open configuration as illustrated in FIG. 2B. Hinge detection engine 114 can analyze the strength of the field, flux, radiation, resistance, etc. from off-center lobe 116 and determine that the angle of rotation of first housing 104 relative to second housing 106 (or determined position of first housing 104 relative to second housing 106) is in the relatively flat position illustrated in FIG. 2C. It should be noted that the distance between off-center lobe 116 and hinge detection engine 114 in the closed, open, and flat position is a matter of design choice. For example, the distance between off-center lobe 116 and hinge detection engine 114 in the closed configuration illustrated in FIG. 2A may be further than the open configuration illustrated in FIG. 2B and the flat configuration illustrated in FIG. 2C or the distance between off-center lobe 116 and hinge detection engine 114 in the open configuration illustrated in FIG. 2B may be further than the closed configuration illustrated in FIG. 2A and the flat configuration illustrated in FIG. 2C.

Figure 3:
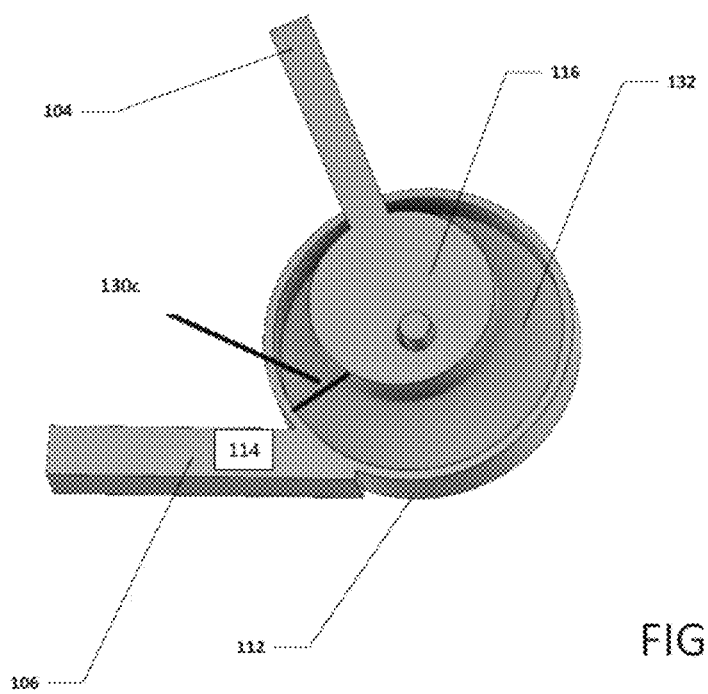
FIG. 3 is a simplified block diagram of a portion of a system to enable a hinge angle detection system, in accordance with an embodiment of the present disclosure.

Turning to FIG. 3, FIG. 3 is a simplified block diagram of a portion of an electronic device configured to include a hinge angle detection system. As illustrated in FIG. 3, a gap 132 exists between hinge detection engine 114 and off-center lobe 116. As first housing 104 rotates relative to second housing 106, distance 130c between hinge detection engine 114 and off-center lobe 116 changes. In an example, a decrease in distance 130c increases the capacitance detected by hinge detection engine 114 and can be used by hinge detection engine 114 to determine the angle of first housing 104 relative to second housing 106. In some examples, gap 132 may be a cavity that can be filled will a fluid or other material to help first housing rotate relative to second housing. The fluid may be a high dielectric oil such as linseed oil. In an example, off-centered lobe 116 can be hermetically sealed.

Figure 4:
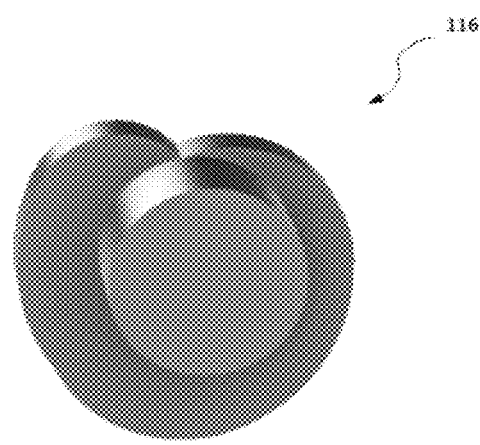
FIG. 4 is a simplified diagram of a portion of a system to enable a hinge angle detection system, in accordance with an embodiment of the present disclosure.

Turning to FIG. 4, FIG. 4 is a simplified block diagram of a portion of an electronic device configured to include a hinge angle detection system. In an example, as illustrated in FIG. 4, off-center lobe 116 may have a heart shaped profile. It should be noted that off-center lobe 116 can have almost any profile that allows for the condition of the field, flux, radiation, resistance, etc. that can be detected by hinge detection engine 114 to become stronger or weaker as first housing 104 is rotated relative to second housing 106.

Figure 5:
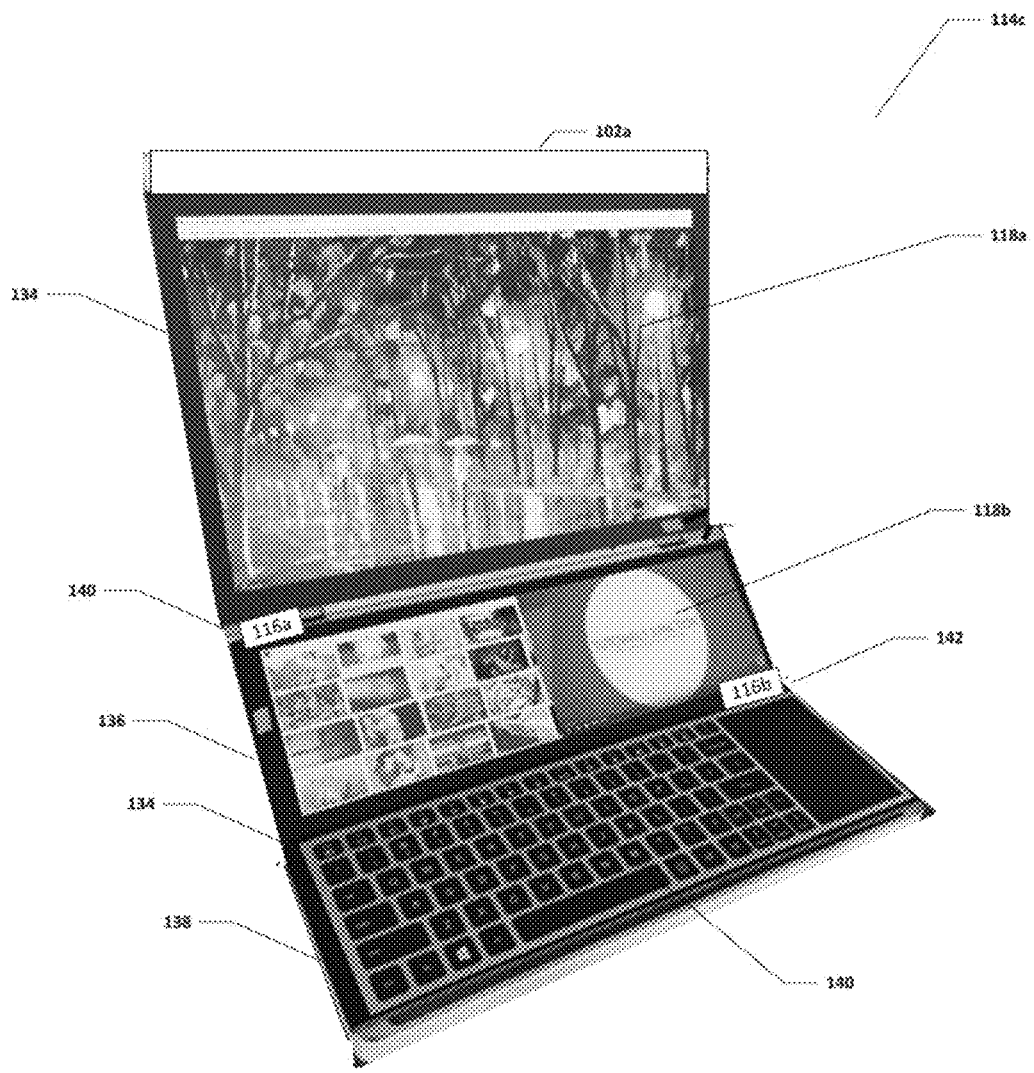
FIG. 5 is a simplified block diagram of a system to enable a hinge angle detection system, in accordance with an embodiment of the present disclosure.

Turning to FIG. 5, FIG. 5 is a simplified block diagram of an electronic device configured to include a hinge angle detection system. As illustrated in FIG. 5, electronic device 102a can include a first display 118a, a second display 118b, a primary display housing 134, a secondary display housing 136, and a third housing 138. Primary display housing 134 can be rotatably coupled to secondary display housing 136 using a first hinge 140. First hinge 140 can include off-center lobe 116a. Secondary display housing 136 can be rotatably coupled to third housing 138 using a second hinge 142. Second hinge 142 can include off-center lobe 116b. Primary display housing 134 can include first display 118a. Secondary display housing 136 can include second display 118b. In an example, a first hinge detection engine (not shown) can be located in secondary display housing 136 to help detect the rotation of primary display housing 134 relative to secondary display housing 136. In addition, a second hinge detection engine (not shown) can be located in third housing 138 to help detect the rotation of secondary display housing 136 relative to third housing 138. Based on the determined angle of rotation of primary display housing 134 relative to secondary display housing 136 and/or the rotation of secondary display housing 136 relative to third housing 138, an image on first display 118a and/or second display 118b can be changed.

Figure 6:
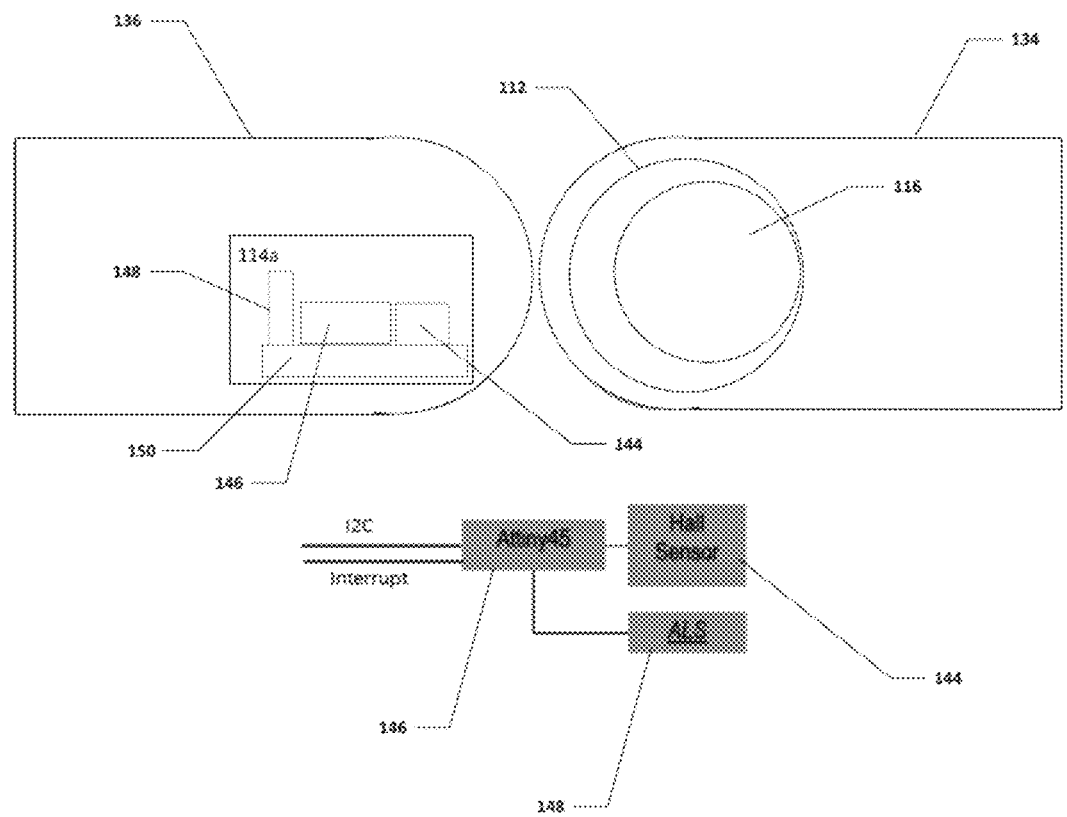
FIG. 6 is a simplified block diagram of a portion of a system to enable a hinge angle detection system, in accordance with an embodiment of the present disclosure.

Turning to FIG. 6, FIG. 6 is a simplified block diagram of a portion of an electronic device configured to include a hinge angle detection system. As illustrated in FIG. 6, primary display housing can include hinge 112 and off-center lobe 116. Secondary display housing can include hinge detection engine 114a. Hinge detection engine 114a can include a linear sensor 144, a microcontroller 146, a logic circuit 148, and a printed circuit board 150. In an example, linear sensor 144 may be a transducer or more specifically, a hall effect sensor that can detect the strength of the field, flux, radiation, resistance, etc. from off-center lobe 116. Logic circuit 148 may be an advanced low power Schottky logic circuit.

Figure 7:
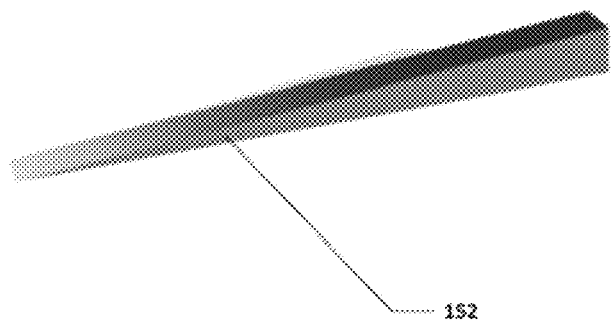
FIG. 7 is a simplified block diagram of a portion of a system to enable a housing detection system, in accordance with an embodiment of the present disclosure.

Turning to FIG. 7, FIG. 7 is a simplified block diagram of a portion of an electronic device configured to include a housing detection system. As illustrated in FIG. 7, linear wedge 152 can be configured to generate a field, flux, radiation, resistance, etc. that can be detected by a detection engine. Some applications require linear sensing. For the purpose of linear movement, linear wedge 152 can either be attached or enclosed within a housing. In other examples, linear wedge 152 may be part of a hinge mechanism itself.

Figure 8A:
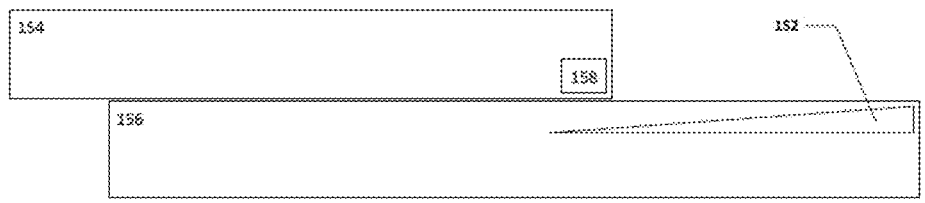
FIGS. 8A and 8B are simplified block diagrams of a portion of a system to enable a housing detection system, in accordance with an embodiment of the present disclosure.
Figure 8B:
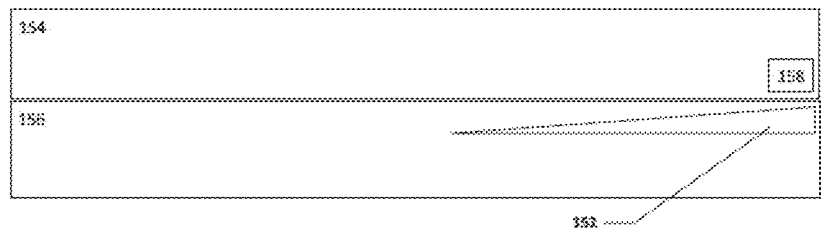

Turning to FIGS. 8A and 8B, FIGS. 8A and 8B are a simplified block diagrams of a portion of an electronic device configured to include a housing detection system. As illustrated in FIG. 8A, a first linear housing 154 can be slide or otherwise moved over a second linear housing 156. Second linear housing 156 can include linear wedge 152 and first linear housing 154 can include a wedge detection engine 158.

Linear wedge 152 can be configured to generate a field, flux, radiation, resistance, etc. that can be detected by wedge detection engine 158. As first linear housing 154 moves over second linear housing 156, the field, flux, radiation, resistance, etc. from linear wedge 152 that can be detected by wedge detection engine 158 becomes stronger or weaker due to the wedge shape of linear wedge 152. Wedge detection engine 158 can analyze the change in the field, flux, radiation, resistance, etc. and determine the position of first linear housing 154 relative to second linear housing 156. For example, as illustrated in FIG. 8A, the distance between linear wedge 152 and wedge detection engine 158 is relatively far and the field, flux, radiation, resistance, etc. from linear wedge 152 that can be detected by wedge detection engine 158 would be relatively weak. The relatively weak field, flux, radiation, resistance, etc. from linear wedge 152 that was detected by wedge detection engine 158 can be used by wedge detection engine 158 to determine that, relative to second linear housing 156, first linear housing 154 is in the position illustrated in FIG. 8A. In contrast, as illustrated in FIG. 8B, the distance between linear wedge 152 and wedge detection engine 158 is relatively close and the field, flux, radiation, resistance, etc. from linear wedge 152 that can be detected by wedge detection engine 158 would be relatively strong. The relatively strong field, flux, radiation, resistance, etc. from linear wedge 152 that was detected by wedge detection engine 158 can be used by wedge detection engine 158 to determine that, relative to second linear housing 156, first linear housing 154 is in the position illustrated in FIG. 8B.

Figure 9:
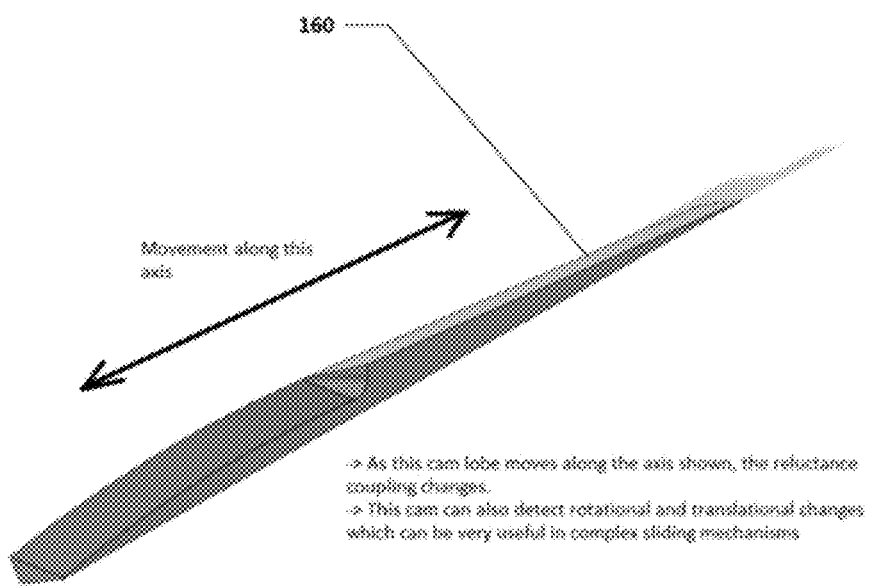
FIG. 9 is a simplified block diagram of a portion of a system to enable a housing detection system, in accordance with an embodiment of the present disclosure.

Turning to FIG. 9, FIG. 9 is a simplified block diagram of a portion of an electronic device configured to include a housing detection system. For the detection of complex linear and rotational movements, a cam lobe 160 may be used. Cam lobe 160 can be configured to generate a field, flux, radiation, resistance, etc. that can be detected by a housing detection engine. As a housing moves relative to another housing, the field, flux, radiation, resistance, etc. from cam lobe that can be detected by the housing detection engine becomes stronger or weaker due to shape of cam lobe 160. The housing detection engine can analyze the change in the field, flux, radiation, resistance, etc. and determine the position of a housing relative to another linear housing. Note that the shape of cam lobe 160 illustrated in FIG. 9 is for illustration purposes only and cam lobe 160 may have a different shape or profile depending on design requirements and the type of movement to be detected between two or more housings.

Figure 10:
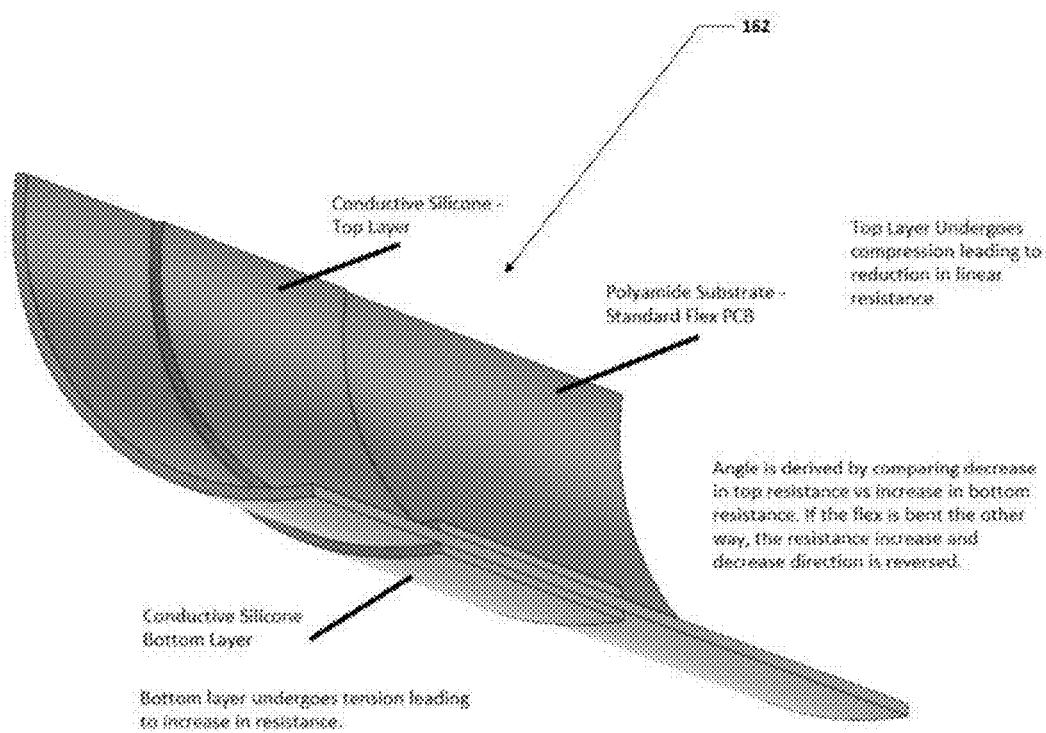
FIG. 10 is a simplified block diagram of a portion of a system to enable a housing detection system, in accordance with an embodiment of the present disclosure.

Turning to FIG. 10, FIG. 10 is a simplified block diagram of a portion of an electronic device configured to include a position detection system 162. In some examples like folding display systems, the system is void of any hinge or moving part. In some cases, the hinge can also be a leather or alcantara material that acts as a hinge. In these cases, a conductive silicone may be used to detected a position of a system. In an example, the conductive silicone may be RTV Silicone with dibutyltin dilaurate catalyst with 36~40% V/V of Graphite powder (1 um or lower sieve). This composition is applied over two silver end points that act as sensing points.

Figure 11:
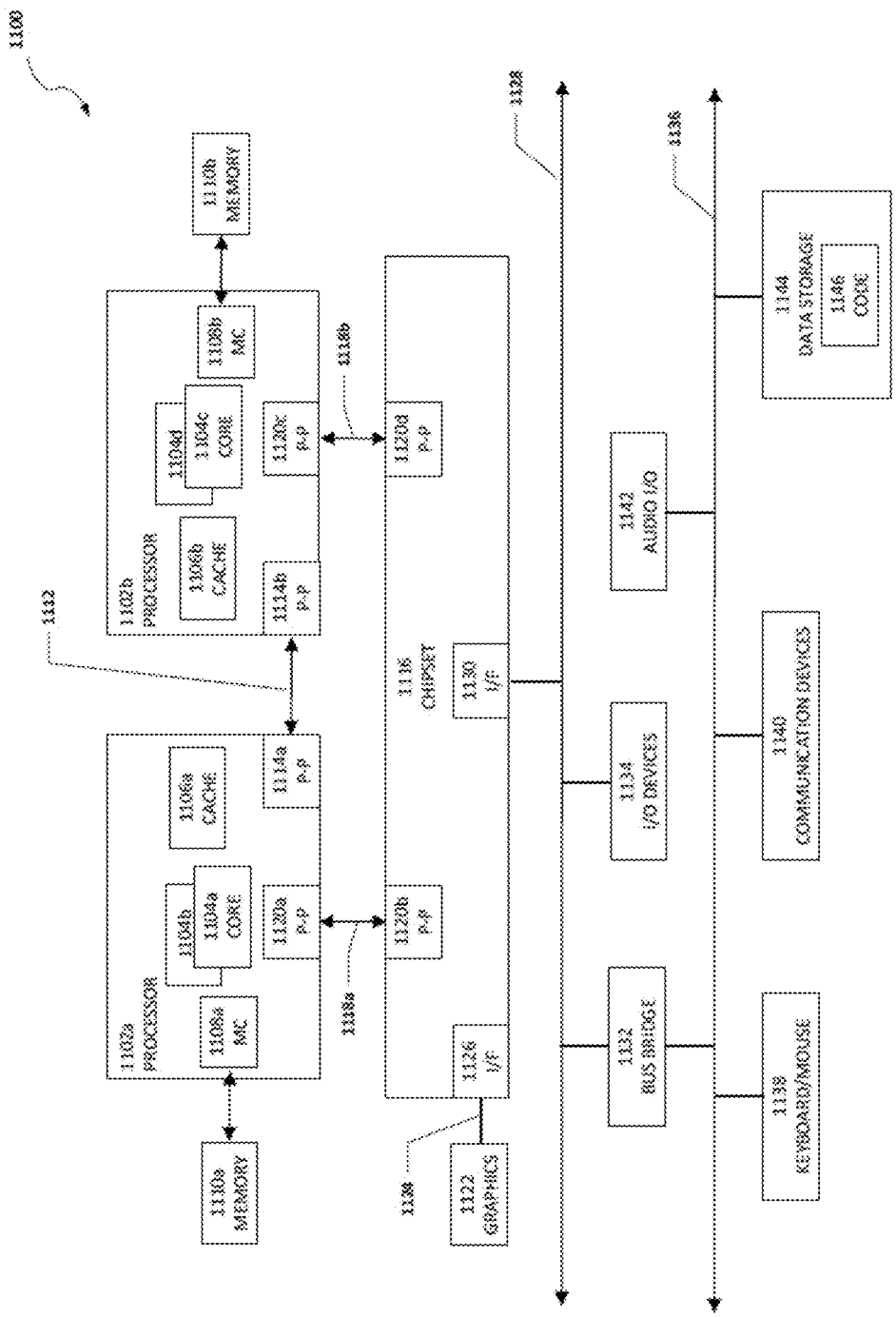
FIG. 11 is a block diagram illustrating an example computing system that is arranged in a point-to-point configuration in accordance with an embodiment.

Turning to FIG. 11, FIG. 11 illustrates a computing system 1100 that is arranged in a point-to-point (PtP) configuration according to an embodiment. In particular, FIG. 11 shows a system where processors, memory, and input/output devices are interconnected by a number of point-to-point interfaces. Generally, electronic device 102 may be configured in the same or similar manner as computing system 1100.

As illustrated in FIG. 11, system 1100 may include several processors, of which only two, processors 1102a and 1102b, are shown for clarity. While two processors 1102a and 1102b are shown, it is to be understood that an embodiment of system 1100 may also include only one such processor. Processors 1102a and 1102b may each include a set of cores (i.e., processors cores 1104a and 1104b and processors cores 1104c and 1104d) to execute multiple threads of a program. The cores may be configured to execute instruction code in a manner similar to that discussed above with reference to FIGS. 1-11. Each processor 1102a and 1102b may include at least one shared cache 1106a and 1106b respectively. Shared caches 1106a and 1106b may each store data (e.g., instructions) that are utilized by one or more components of processors 1102a and 1102b, such as processor cores 1104a and 1104b of processor 1102a and processor cores 1104c and 1104d of processor 1102b.

Processors 1102a and 1102b may also each include integrated memory controller logic (MC) 1108a and 1108b respectively to communicate with memory elements 1110a and 1110b. Memory elements 1110a and/or 1110b may store various data used by processors 1102a and 1102b. In alternative embodiments, memory controller logic 1108a and 1108b may be discrete logic separate from processors 1102a and 1102b.

Processors 1102a and 1102b may be any type of processor and may exchange data via a point-to-point (PtP) interface 1112 using point-to-point interface circuits 1114a and 1114b respectively. Processors 1102a and 1102b may each exchange data with a chipset 1116 via individual point-to-point interfaces 1118a and 1118b using point-to-point interface circuits 1120a-1120d. Chipset 1116 may also exchange data with a high-performance graphics circuit 1122 via a high-performance graphics interface 1124, using an interface circuit 1126, which could be a PtP interface circuit. In alternative embodiments, any or all of the PtP links illustrated in FIG. 11 could be implemented as a multi-drop bus rather than a PtP link.

Chipset 1116 may be in communication with a bus 1128 via an interface circuit 1130. Bus 1128 may have one or more devices that communicate over it, such as a bus bridge 1132 and I/O devices 1134. Via a bus 1136, bus bridge 1132 may be in communication with other devices such as a keyboard/mouse 1138 (or other input devices such as a touch screen, trackball, etc.), communication devices 1140 (such as modems, network interface devices, or other types of communication devices that may communicate through a network), audio I/O devices 1142, and/or a data storage device 1144. Data storage device 1144 may store code 1146, which may be executed by processors 1102a and/or 1102b. In alternative embodiments, any portions of the bus architectures could be implemented with one or more PtP links.

The computer system depicted in FIG. 11 is a schematic illustration of an embodiment of a computing system that may be utilized to implement various embodiments discussed herein. It will be appreciated that various components of the system depicted in FIG. 11 may be combined in a system-on-a-chip (SoC) architecture or in any other suitable configuration. For example, embodiments disclosed herein can be incorporated into systems including mobile devices such as smart cellular telephones, tablet computers, personal digital assistants, portable gaming devices, etc. It will be appreciated that these mobile devices may be provided with SoC architectures in at least some embodiments.

Figure 12:
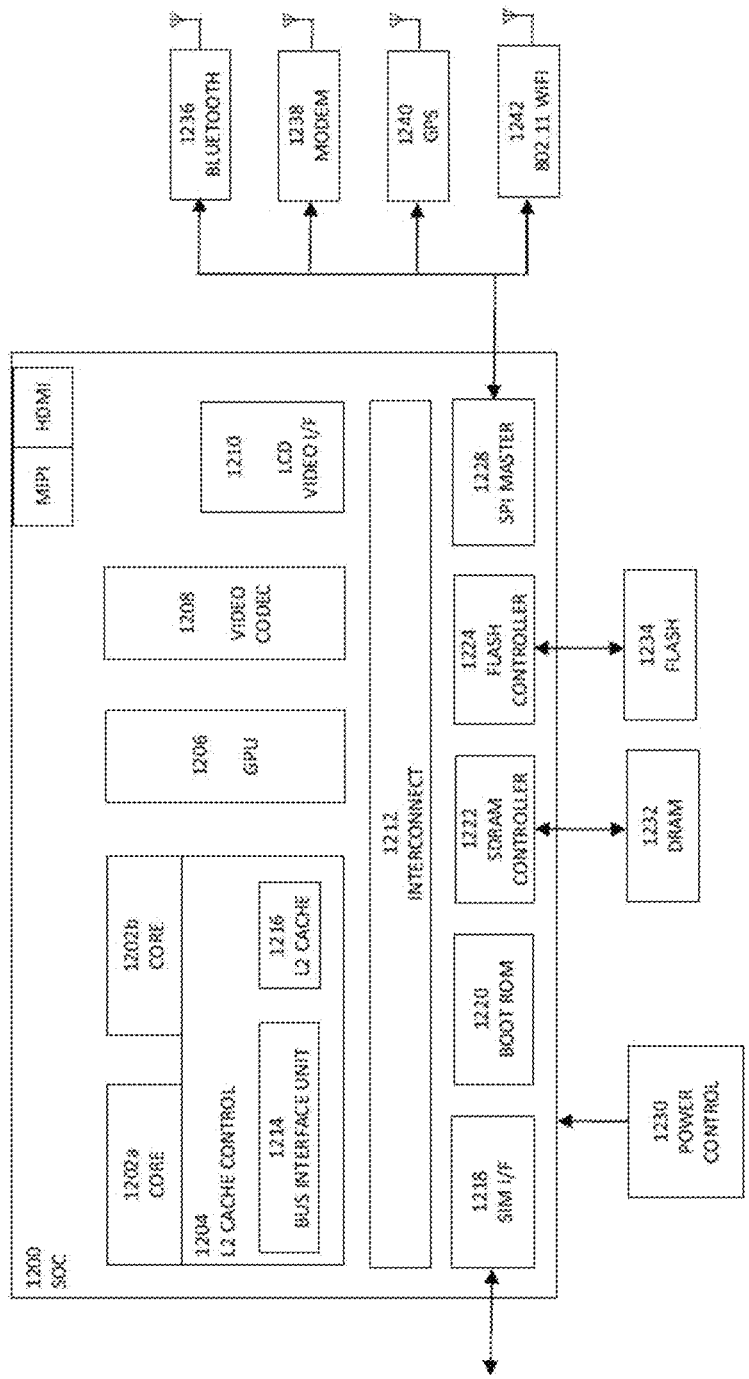
FIG. 12 is a simplified block diagram associated with an example ARM ecosystem system on chip (SOC) of the present disclosure.

Turning to FIG. 12, FIG. 12 is a simplified block diagram associated with an example ecosystem SOC 1200 of the present disclosure. At least one example implementation of the present disclosure can include the device pairing in a local network features discussed herein and an ARM component. For example, the example of FIG. 12 can be associated with any ARM core (e.g., A-9, A-15, etc.). Further, the architecture can be part of any type of tablet, smartphone (inclusive of Android™ phones, iPhones™), iPad™, Google Nexus™, Microsoft Surface™, personal computer, server, video processing components, laptop computer (inclusive of any type of notebook), Ultrabook™ system, any type of touch-enabled input device, etc.

In this example of FIG. 12, ecosystem SOC 1200 may include multiple cores 1202a and 1202b, an L2 cache control 1204, a graphics processing unit (GPU) 1206, a video codec 1208, a liquid crystal display (LCD) I/F 1210 and an interconnect 1212. L2 cache control 1204 can include a bus interface unit 1214, a L2 cache 1216. Liquid crystal display (LCD) I/F 1210 may be associated with mobile industry processor interface (MIPI)/high-definition multimedia interface (HDMI) links that couple to an LCD.

Ecosystem SOC 1200 may also include a subscriber identity module (SIM) I/F 1218, a boot read-only memory (ROM) 1220, a synchronous dynamic random-access memory (SDRAM) controller 1222, a flash controller 1224, a serial peripheral interface (SPI) master 1228, a suitable power control 1230, a dynamic RAM (DRAM) 1232, and flash 1234. In addition, one or more embodiments include one or more communication capabilities, interfaces, and features such as instances of Bluetooth™ 1236, a 3G modem 1238, a global positioning system (GPS) 1240, and an 802.11 Wi-Fi 1242.

In operation, the example of FIG. 12 can offer processing capabilities, along with relatively low power consumption to enable computing of various types (e.g., mobile computing, high-end digital home, servers, wireless infrastructure, etc.). In addition, such an architecture can enable any number of software applications (e.g., Android™, Adobe® Flash® Player, Java Platform Standard Edition (Java SE), JavaFX, Linux, Microsoft Windows Embedded, Symbian and Ubuntu, etc.). In at least one example embodiment, the core processor may implement an out-of-order superscalar pipeline with a coupled low-latency level-2 cache.

Figure 13:
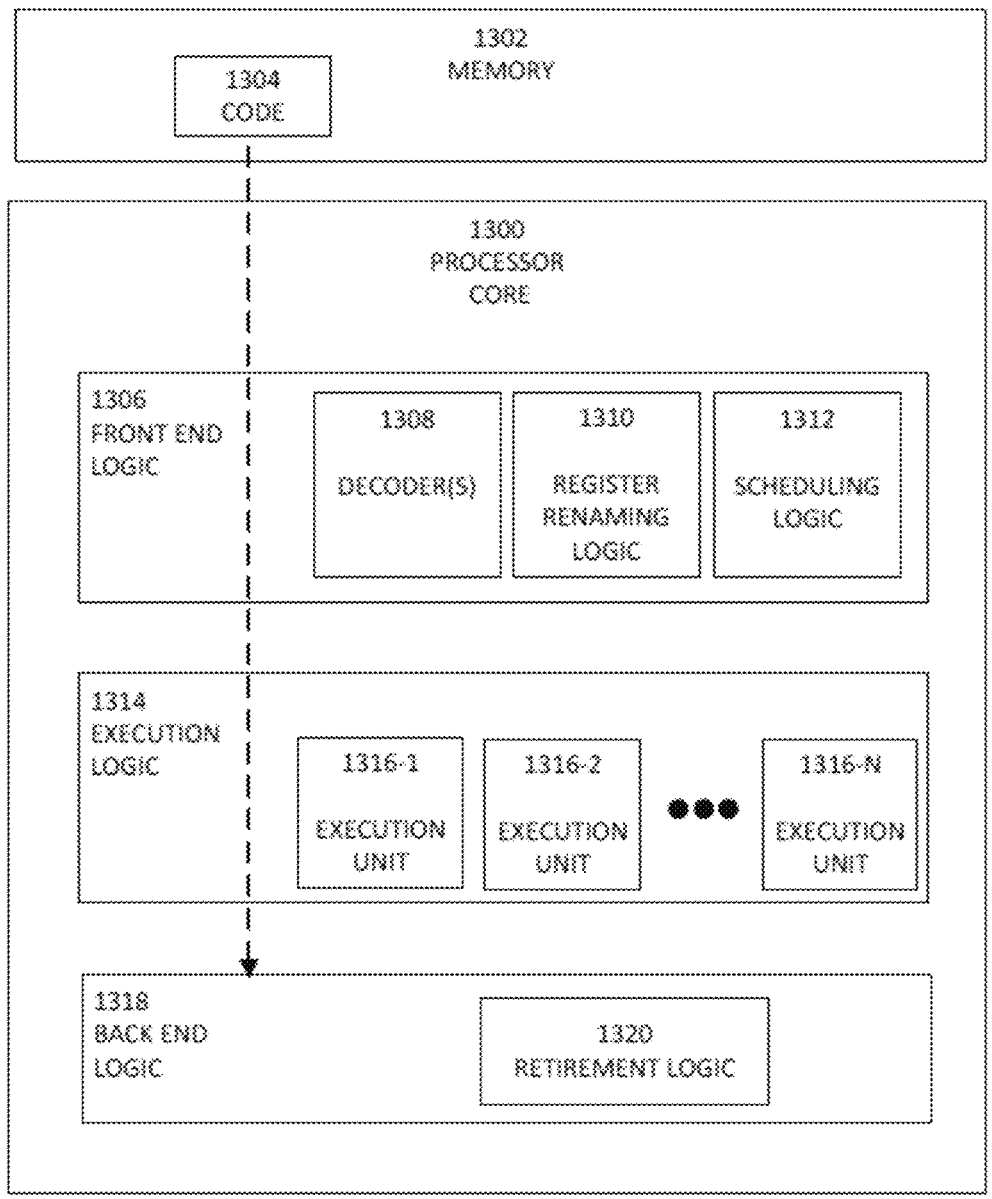
FIG. 13 is a block diagram illustrating an example processor core in accordance with an embodiment.

Turning to FIG. 13, FIG. 13 illustrates a processor core 1300 according to an embodiment. Processor core 1300 may be the core for any type of processor, such as a microprocessor, an embedded processor, a digital signal processor (DSP), a network processor, or other device to execute code. Although only one processor core 1300 is illustrated in FIG. 13, a processor may alternatively include more than one of the processor core 1300 illustrated in FIG. 13. For example, processor core 1300 represents one example embodiment of processors cores 1104a-1104d shown and described with reference to processors 1102a and 1102b of FIG. 11. Processor core 1300 may be a single-threaded core or, for at least one embodiment, processor core 1300 may be multi-threaded in that it may include more than one hardware thread context (or "logical processor") per core.

FIG. 13 also illustrates a memory 1302 coupled to processor core 1300 in accordance with an embodiment. Memory 1302 may be any of a wide variety of memories (including various layers of memory hierarchy) as are known or otherwise available to those of skill in the art. Memory 1302 may include code 1304, which may be one or more instructions, to be executed by processor core 1300. Processor core 1300 can follow a program sequence of instructions indicated by code 1304. Each instruction enters a front-end logic 1306 and is processed by one or more decoders 1308. The decoder may generate, as its output, a micro operation such as a fixed width micro operation in a predefined format, or may generate other instructions, microinstructions, or control signals that reflect the original code instruction. Front-end logic 1306 also includes register renaming logic 1310 and scheduling logic 1312, which generally allocate resources and queue the operation corresponding to the instruction for execution.

Processor core 1300 can also include execution logic 1314 having a set of execution units 1316-1 through 1316-N. Some embodiments may include a number of execution units dedicated to specific functions or sets of functions. Other embodiments may include only one execution unit or one execution unit that can perform a particular function. Execution logic 1314 performs the operations specified by code instructions.

After completion of execution of the operations specified by the code instructions, back-end logic 1318 can retire the instructions of code 1304. In one embodiment, processor core 1300 allows out of order execution but requires in order retirement of instructions. Retirement logic 1320 may take a variety of known forms (e.g., re-order buffers or the like). In this manner, processor core 1300 is transformed during execution of code 1304, at least in terms of the output generated by the decoder, hardware registers and tables utilized by register renaming logic 1310, and any registers (not shown) modified by execution logic 1314.

Although not illustrated in FIG. 13, a processor may include other elements on a chip with processor core 1300, at least some of which were shown and described herein with reference to FIG. 11. For example, as shown in FIG. 11, a processor may include memory control logic along with processor core 1300. The processor may include I/O control logic and/or may include I/O control logic integrated with memory control logic.

Note that with the examples provided herein, interaction may be described in terms of two, three, or more network elements. However, this has been done for purposes of clarity and example only. In certain cases, it may be easier to describe one or more of the functionalities of a given set of flows by only referencing a limited number of network elements. It should be appreciated that system 100 and its teachings are readily scalable and can accommodate a large number of components, as well as more complicated/sophisticated arrangements and configurations. Accordingly, the examples provided should not limit the scope or inhibit the broad teachings of system 100 as potentially applied to a myriad of other architectures.

It is also important to note that the operations in the preceding flow diagrams (i.e., FIGS. 3-6B) illustrate only some of the possible correlating scenarios and patterns that may be executed by, or within, system 100. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by system 100 in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although system 100 has been illustrated with reference to particular elements and operations that facilitate the communication process, these elements and operations may be replaced by any suitable architecture, protocols, and/or processes that achieve the intended functionality of system 100

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include a first housing, a second housing, and a hinge. The hinge rotatably couples the first housing to the second housing, wherein the hinge includes an off-center lobe that generates a field, wherein the second housing includes a detection engine to detect a strength of the field generated by the off-center lobe and determines a position of the first housing relative to the second housing based on the detected strength of the field generated by the off-center lobe.

In Example A2, the subject matter of Example A1 can optionally include where the off-center lobe generates a magnetic reluctance field.

In Example A3, the subject matter of any one of Examples A1-A2 can optionally include where the detection engine includes a transducer to detect the strength of the field generated by the off-center lobe.

In Example A4, the subject matter of any one of Examples A1-A3 can optionally include where the detection engine includes a hall effect sensor to detect the strength of the field generated by the off-center lobe.

In Example A5, the subject matter of any one of Examples A1-A4 can optionally include where the hinge and off-center lobe are located in the first housing.

In Example A6, the subject matter of any one of Examples A1-A5 can optionally include a third housing rotatably coupled to the second housing using a second hinge, wherein the second hinge includes a second off-center lobe that generates a second field, wherein the third housing includes a second detection engine to detect a strength of the second field generated by the second off-center lobe and to determine a position of the second housing relative to the third housing based on the detected strength of the second field generated by the second off-center lobe.

In Example A7, the subject matter of any one of Examples A1-A6 can optionally include where the first housing includes a display.

In Example A8, the subject matter of any one of Examples A1-A7 can optionally include where the electronic device is a laptop computer.

Example M1 is a method including determining that a first housing is rotated relative to a second housing about a hinge that rotatably couples the first housing to the second housing, detecting a strength of a field generated by an off-center lobe, wherein the off-center lobe is located in the hinge, and determining a hinge angle based on the detected strength of the field generated by the off-center lobe.

In Example M2, the subject matter of Example M1 can optionally include where the off-center lobe generates a magnetic reluctance field.

In Example M3, the subject matter of any one of the Examples M1-M2 can optionally include where a transducer that measures changes in magnetic reluctance detects the strength of the field generated by the off-center lobe.

In Example M4, the subject matter of any one of the Examples M1-M3 can optionally include where the transducer is a hall effect sensor.

In Example M5, the subject matter of any one of the Examples M1-M4 can optionally include where the hinge and off-center lobe are located in the first housing.

In Example M6, the subject matter of any one of the Examples M1-M5 can optionally include where the first housing includes a display.

Example C1 is at least one machine readable storage medium having one or more instructions that when executed by at least one processor, cause the at least one processor to determine that a first housing is rotated relative to a second housing about a hinge that rotatably couples the first housing to the second housing, detect a strength of a field generated by an off-center lobe, wherein the off-center lobe is located in the hinge, and determine a hinge angle based on the detected strength of the field generated by the off-center lobe.

In Example C2, the subject matter of Example C1 can optionally include where the off-center lobe generates a magnetic reluctance field.

In Example C3, the subject matter of any one of Examples C1-C2 can optionally include where a transducer that measures changes in magnetic reluctance detects the strength of the field generated by the off-center lobe.

In Example C4, the subject matter of any one of Examples C1-C3 can optionally include where the transducer is a hall effect sensor.

In Example C5, the subject matter of any one of Examples C1-C4 can optionally include where the hinge and off-center lobe are located in the first housing.

In Example C6, the subject matter of any one of Examples C1-C5 can optionally include where the first housing includes a display.

In Example C7, the subject matter of any one of Examples C1-C6 can optionally include changing an image on the display based on the determined hinge angle.

Example S1 is a system for determining a hinge angle. The system can include a first housing, a hinge, wherein the hinge rotatably couples the first housing to a second housing, an off-center lobe located in the hinge, wherein the off-center lobe generates a field, and a hinge detection engine located in the second housing, wherein the hinge detection engine detects a strength of the field generated by the off-center lobe and determines a hinge angle based on the detected strength of the field generated by the off-center lobe.

In Example S2, the subject matter of Example S1 can optionally include where the off-center lobe generates a magnetic reluctance field.

In Example S3, the subject matter of any one of the Examples S1-S2 can optionally include where the hinge detection engine includes a transducer to detect the strength of the field generated by the off-center lobe.

In Example S4, the subject matter of any one of the Examples S1-S3 can optionally include where the hinge detection engine includes a hall effect sensor to detect the strength of the field generated by the off-center lobe.

In Example S5, the subject matter of any one of the Examples S1-S4 can optionally include where the hinge and off-center lobe are located in the first housing.

Example AA1 is an apparatus including means for determining that a first housing is rotated relative to a second housing about a hinge that rotatably couples the first housing to the second housing, means for detecting a strength of a field generated by an off-center lobe, wherein the off-center lobe is located in the hinge, and means for determining a hinge angle based on the detected strength of the field generated by the off-center lobe.

In Example AA2, the subject matter of Example AA1 can optionally include where the off-center lobe generates a magnetic reluctance field.

In Example AA3, the subject matter of any one of Examples AA1-AA2 can optionally include where a transducer that measures changes in magnetic reluctance detects the strength of the field generated by the off-center lobe.

In Example AA4, the subject matter of any one of Examples AA1-AA3 can optionally include where the transducer is a hall effect sensor.

In Example AA5, the subject matter of any one of Examples AA1-AA4 can optionally include where the hinge and off-center lobe are located in the first housing.

In Example AA6, the subject matter of any one of Examples AA1-AA5 can optionally include where the first housing includes a display.

In Example AA7, the subject matter of any one of Examples AA1-AA6 can optionally include means for changing an image on the display based on the determined hinge angle.

Example X1 is a machine-readable storage medium including machine-readable instructions to implement a method or realize an apparatus as in any one of the Examples A1-A8, AA1-AA7, or M1-M6. Example Y1 is an apparatus comprising means for performing any of the Example methods M1-M6. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. An electronic device comprising:
   a first housing;
   a second housing; and
   a hinge, wherein the hinge rotatably couples the first housing to the second housing using a single axis of rotation, wherein the hinge includes an off-center lobe that generates a field, wherein the second housing includes a detection engine to detect a strength of the field generated by the off-center lobe and determines a hinge angle relative to the second housing based on the detected strength of the field generated by the off-center lobe.

2. The electronic device of claim 1, wherein the off-center lobe generates a magnetic reluctance field.

3. The electronic device of claim 1, wherein the detection engine includes a transducer to detect the strength of the field generated by the off-center lobe.

4. The electronic device of claim 1, wherein the detection engine includes a hall effect sensor to detect the strength of the field generated by the off-center lobe.

5. The electronic device of claim 1, wherein the hinge and off-center lobe are located in the first housing.

6. The electronic device of claim 1, further comprising:
   a third housing rotatably coupled to the second housing using a second hinge, wherein the second hinge includes a second off-center lobe that generates a second field, wherein the third housing includes a second detection engine to detect a strength of the second field generated by the second off-center lobe and to determine a position of the second housing relative to the third housing based on the detected strength of the second field generated by the second off-center lobe.

7. The electronic device of claim 1, wherein the electronic device is a laptop computer and the first housing includes a display.

8. The electronic device of claim 1, wherein the off-center lobe is inside a cavity filled with a dielectric fluid.

9. A method comprising:
   determining that a first housing is rotated relative to a second housing about a hinge that rotatably couples the first housing to the second housing using a single axis of rotation;
   detecting a strength of a field generated by an off-center lobe, wherein the off-center lobe is located in the hinge inside a cavity filled with fluid; and
   determining a hinge angle based on the detected strength of the field generated by the off-center lobe.

10. The method of claim 9, wherein the off-center lobe generates a magnetic reluctance field.

11. The method of claim 9, wherein a transducer that measures changes in magnetic reluctance detects the strength of the field generated by the off-center lobe.

12. The method of claim 11, wherein the transducer is a hall effect sensor.

13. The method of claim 9, wherein the hinge and off-center lobe are located in the first housing.

14. The method of claim 9, wherein the first housing includes a display.

15. The method of claim 14, further comprising:
changing an image on the display based on the determined hinge angle.

16. A system for determining a hinge angle, the system comprising:
a first housing;
a hinge, wherein the hinge rotatably couples the first housing to a second housing;
an off-center lobe located in the hinge, wherein the off-center lobe generates a field;
a hinge detection engine located in the second housing, wherein the hinge detection engine detects a strength of the field generated by the off-center lobe and determines a hinge angle based on the detected strength of the field generated by the off-center lobe; and
a third housing rotatably coupled to the second housing using a second hinge, wherein the second hinge includes a second off-center lobe that generates a second field, wherein the third housing includes a second detection engine to detect a strength of the second field generated by the second off-center lobe and to determine a position of the second housing relative to the third housing based on the detected strength of the second field generated by the second off-center lobe.

17. The system of claim 16, wherein the off-center lobe generates a magnetic reluctance field.

18. The system of claim 17, wherein the hinge detection engine includes a transducer to detect the strength of the field generated by the off-center lobe.

19. The system of claim 16, wherein the hinge detection engine includes a hall effect sensor to detect the strength of the field generated by the off-center lobe.

20. The system of claim 16, wherein the hinge and off-center lobe are located in the first housing.

* * * * *